(12) United States Patent
Kim et al.

(10) Patent No.: US 6,767,687 B1
(45) Date of Patent: Jul. 27, 2004

(54) POLYMER FOR CHEMICALLY AMPLIFIED RESIST AND A RESIST COMPOSITION USING THE SAME

(75) Inventors: Deog-Bae Kim, Hwaseong-kun (KR); Hyun-Jin Kim, Hwaseong-kun (KR); Yong-Joon Choi, Hwaseong-kun (KR); Yoon-Sik Chung, Hwaseong-kun (KR)

(73) Assignee: Dongjin Semichem Co., Ltd., Incheon (KR)

( * ) Notice: Subject to any disclaimer, the term of this patent is extended or adjusted under 35 U.S.C. 154(b) by 159 days.

(21) Appl. No.: 10/070,477

(22) PCT Filed: Aug. 25, 2000

(86) PCT No.: PCT/KR00/00956

§ 371 (c)(1),
(2), (4) Date: Jul. 23, 2002

(87) PCT Pub. No.: WO01/18603

PCT Pub. Date: Mar. 15, 2001

(30) Foreign Application Priority Data

Sep. 7, 1999 (KR) ............................................ 11-37772

(51) Int. Cl.$^7$ .............................................. G03F 7/004
(52) U.S. Cl. ...................... 430/270.1; 430/914; 522/35
(58) Field of Search ............................ 430/270.1, 914; 522/35

(56) References Cited

U.S. PATENT DOCUMENTS

| | | | |
|---|---|---|---|
| 4,491,628 A | | 1/1985 | Ito et al. |
| 5,310,619 A | | 5/1994 | Crivello et al. |
| 5,443,690 A | | 8/1995 | Takechi et al. |
| 5,492,793 A | | 2/1996 | Breyta et al. |
| 5,556,734 A | | 9/1996 | Yamachika et al. |
| 5,679,495 A | | 10/1997 | Yamachika et al. |
| 5,773,191 A | | 6/1998 | Padmanaban et al. |
| 5,976,759 A | * | 11/1999 | Urano et al. ............. 430/270.1 |
| 6,045,970 A | * | 4/2000 | Choi ........................ 430/270.1 |
| 6,083,659 A | * | 7/2000 | Choi ........................ 430/270.1 |
| 6,165,680 A | * | 12/2000 | Choi ........................ 430/270.1 |
| 6,395,450 B1 | * | 5/2002 | Park et al. ............... 430/270.1 |
| 2003/0181629 A1 | * | 9/2003 | Kim et al. ................. 528/247 |

FOREIGN PATENT DOCUMENTS

| | | |
|---|---|---|
| EP | 0404206 A2 | 5/1983 |
| EP | 0786701 A1 | 7/1997 |
| EP | 0793144 A2 | 9/1997 |
| EP | 0877294 A1 | 11/1998 |
| JP | 02227660 | 9/1990 |
| JP | 05113667 | 5/1993 |
| JP | 05232706 | 9/1993 |
| JP | 05249683 | 9/1993 |

OTHER PUBLICATIONS

MacDonald et al., "Airborne Chemical Contamination of a Chemically Amplified Resist," *SPIE*, vol. 1466 (1991).
Schlegel, 37th Japanese Applied Physics Society Announcement, 28p–ZE–4 (1990).
Ueno et al., 36th Japanese Applied Physics Society Announcement, 1p–k–7, (1989).
Ito et al., "Applications of Photoinitiators to the Design of Resists for Semiconductor Manufacturing," *Polymers in Electronics*, American Chemical Society, pp. 11–23 (1984).

\* cited by examiner

*Primary Examiner*—Mark F. Huff
*Assistant Examiner*—Amanda Walke
(74) *Attorney, Agent, or Firm*—Baker Botts LLP

(57) ABSTRACT

The present invention relates to a polymer for a chemically amplified resist and a resist composition using the same. The present invention provides a polymer represented by the Formula (1) and a chemically resist composition for extreme ultraviolet light comprising the same. The chemically amplified resist composition comprising the polymer represented by the formula (1) of the present invention responds to mono wavelength in a micro-lithography process and can embody a micro-pattern of high resolution on a substrate.

5 Claims, No Drawings

POLYMER FOR CHEMICALLY AMPLIFIED RESIST AND A RESIST COMPOSITION USING THE SAME

BACKGROUND OF THE INVENTION (a) Field of the Invention

The present invention relates to a polymer for a chemically amplified resist and a resist composition comprising the same More particularly, the present invention relates to a novel polymer that can be used for a chemically amplified resist composition that can form finer patterns on a substrate in a micro-lithography process suitable for micro-processing of semiconductors, using a mono wavelength as the light source for light exposure, and which improves post exposure delay (PED) stability and has high resistance against the heat produced by dry etching, and a resist composition using the same.

(b) Description of the Related Art

The resist composition is generally used in the preparations of large size integrated circuits (LSI) or in high resolution lithography. Recently, resist compositions with high resolution and high sensitivity have been required due to the densification of large size integrated circuits. Such embodiments of microcircuits in semiconductor integrated circuits generally proceed using a lithography process through which process the microcircuit is constructed by coating resist on a substrate, transcribing patterns on the substrate using a prepared photo mask, and etching the substrate along the transcribed pattern.

Such lithography processes comprise the following steps: (a) a coating step comprising uniformly coating resist on the surface of a substrate, (b) a soft baking step comprising evaporating the solvent from the coated resist film to adhere the resist film to the surface of the substrate, (c) a light exposure step comprising light exposing the substrate while projecting the circuit pattern on the mask, repeatedly and sequentially using a light source such as ultraviolet light to transcribe the pattern of the mask onto the substrate, (d) a development step comprising selectively removing the part in which chemical properties such as solubility change by the exposure to the light source using development liquid, (e) a hard baking step for adhering more firmly the resist film that remains on the substrate after development, (f) an etching step comprising etching the predetermined part along the pattern on the developed substrate in order to impart the electric properties and (g) a stripping step comprising removing the resist that becomes unnecessary after said etching step.

The speed of high-integration of semiconductor integrated circuits has increased 4-fold for 3 years. Thus, at present, in the field of dynamic random access memory (DRAM), 64 mega bit DRAM and 256 mega bit DRAM are mass-produced, and the development of giga bit DRAM has started.

The conventional 16 mega DRAM used the technology of a 0.5 $\mu$m circuit line, while 64 mega DRAM uses the technology of a circuit line of 0.3 $\mu$m or less, and 256 mega DRAM and giga DRAM requires an ultra micro pattern of less than quarter micro, such as 0.20 $\mu$m, 0.18 $\mu$m, 0.15 $\mu$m depending on the design. In such micro-processing, the light-radiation wavelength moves to extreme ultraviolet. Therefore, there is a need for the development of a new resist that can effectively respond to extreme ultraviolet light.

The resist of the prior art comprising quinonediazide photoactive material and phenol novolac resin cannot satisfy the above-mentioned requirement, because, in such a resist system, there is a large absorption at the wavelength zone of 300 nm or less and thus, when mono wavelength light-exposure of 300 nm or less is conducted, pattern profile is significantly deteriorated. Therefore, there is a need for the embodiment of a stiff pattern in which the pattern profile does not flow.

In order to embody such a pattern profile, an aligner commonly called a stepper is generally used as a light-exposing apparatus. Such light-exposing apparatuses are divided into an apparatus using G line (wavelength 436 nm), I line (wavelength 365 nm) of mercury light, and an apparatus using an excimer laser of mono wavelength KrF (248 nm) and ArF (193 nm) according to the light source. For embodying micro-patterns on the substrate, the resolution value should be small The resolution value is expressed by the following Rayleigh diffraction limiting equation Theoretically, since the resolution value becomes smaller as the wavelength of the light source becomes shorter, it is preferable to use a shorter mono wavelength.

[Diffraction Limiting Equation]

$R = \kappa \lambda / NA$

Wherein, $\kappa$ is a constant, $\lambda$ is a wavelength of the light used, and NA is the number of the aperture of the lense.

In order to achieve high resolution of a quarter micron or less, the capacity of degradation of lithography should be improved. For this purpose, it is effective to use a mono wavelength light source having a short wavelength and to increase the aperture number (NA) of the optical lense of the exposing apparatus.

Accordingly, a resist composition that uses a high-output excimer laser light source so as to respond to the high-resolution tendency of semiconductor integrated circuits is commonly used. This composition is for a KrF and an ArF excimer laser, and high-sensitivity resist systems introducing the chemical amplification concept are suggested.

A chemically amplified resist produces acid by photolysis due to the irradiation of extreme ultraviolet light. The produced acid degrades the protective group which is partially protected with the aid of heat, and then it reacts with the acid labile polymer to initiate the chain reaction or act as a catalyst, and thus, one molecule of acid causes a number of bond formation or bond degradation reactions Therefore, a term "chemical amplification" means the phenomenon whereby active species produced by the action of one photon causes chemical chain reactions to rapidly amplify the yield of quantum. Due to this continuous reaction of acid, the concept of chemical amplification was introduced and used.

A chemically amplified resist is divided into a two-component system comprising an acid-labile polymer and a mineral acid producing agent and a three-component system comprising an acid-labile polymer, a mineral acid producing agent and a matrix resin. In the resist of the prior art, the degradation or the cross-reaction of a light sensitive material occurs directly at the light exposure part, and, when it is developed, a resist image pattern of a positive or negative form is obtained. However, in the chemically amplified resist, an acid labile polymer or compound is not directly reacted by light exposure, but an acid is produced from the mineral acid producing agent in the light-exposed part, and only a latent image is produced The produced acid acts as a catalyst for the acid labile polymer in the post-exposure bake (PEB) step, and thus, it causes the amplification of the reaction and the significant difference in solubility.

The first resist based upon the chemical amplification concept was a resist using a polyhydroxystyrene derivative poly[p-(t-butyloxycarbonyloxy)styrene] (PBOCSt) blocked with t-BOC (tertiary-butoxy carbonyl) group and onium salt as a mineral acid producing agent, and it is described in American Chemical Society, "Polymers in Electronics", ACS Sym Series, No. 242 by Ito et al. The reason for using the polyhydroxystyrene derivative is as follows since the novolac phenol resin that was used in the resist of the prior art largely absorbs deep UV, UV light cannot sufficiently reach the contact surface of the resist substrate Thus, in the light-exposed part of the resist, chemical changes by light-exposure do not sufficiently occur in the membrane thickness direction, and thus the solubility of the developing liquid becomes irregular. This makes the shape of the section of the resist pattern formed after development triangular Thus when the obtained resist pattern is used as an inner etching mask for a substrate, the micro-circuit pattern to be aimed cannot be transcribed. In order to compensate for this, there is a need to change the base polymer, and a polyhydroxystyrene derivative having excellent plasma resistance is known to be suitable.

As examples, a chemically amplified resist comprising poly(p-styreneoxytetrahydropyranol) and an acid producing agent is known by Ueno et al in the 36$^{th}$ Japanese Applied Physics Society announcement, 1p-k-7, 1989, and a three component system resist comprising novolac phenol resin, bisphenol-A substituted with t-BOC group and pyrogallol methanesulfonic ester is known from Schlegel in the 37th Japanese Applied Physics Society announcement, 28p-ZE4, 1990. In addition, technologies relating to the preparations of said resists are disclosed in JP patent publication Hei 2-27660, JP patent publication Hei 5-232706, JP patent pubication Hei 5-249683, and U.S. Pat. Nos. 4,491,628 and 5,310,619 However, while such chemically amplified resists have excellent resolutions compared to the resist for g-line and I-line of the prior art, they are likely to be affected by the surrounding environment, particularly by oxygen, moisture and other trace ingredients around the membrane surface, and it is difficult to form stable micro patterns because a trace amount of acid is produced in the light-exposed part.

In addition, MacDonald et al. reported in Porc. SPIE, Vol. 1466. 1991 that trace dimethylaniline contained in the air decreases the activity of the acid produced around the surface of the resist by light exposure, and it produces a layer that hardly melts on the membrane surface, and said hardly-melting layer remains on the surface of the resist pattern after development treatment. However, this process has the problem that footing is caused by the reaction of the micro pattern with the substrate due to the time delay from the light exposure to the PEB process, and a T-top type pattern is produced by environmental pollution due to the amine ingredient distributed in the air in the process line. Therefore, there is a need for compensating the PED stability of the resist composition using said compound, and there is a need for a resist composition using a novel base polymer suitable to embody high sensitivity and high resolution at a wavelength of 300 µm or less.

In addition, recently, large size integrated circuit tends to use a dry etching process Said dry process is for increasing integration of semiconductor integrated circuit, and changes the manner of etching on the substrate in the lithography process from wet etching having large side etching of the prior art to dry etching having small side etching. In the dry etching process, the resist pattern should not change by the heat produced when etching. In addition, as the degree of integration increases, higher heat resistance is required by the resist used.

SUMMARY OF THE INVENTION

Accordingly, it is an object of the present invention to provide a novel polymer that can be applied to a chemically amplified resist composition that can form finer patterns on a substrate in a micro lithography process using extreme ultraviolet light, improves post exposure delay stability, and has high resistance against the heat produced by dry etching, and a resist composition using the same.

In order to achieve the above object, the present invention provides a polymer for a chemically amplified resist represented by the following Formula 1

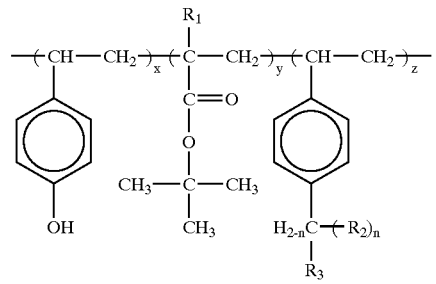

Wherein, $R_1$ is hydrogen or methyl $R_2$ is hydrogen or $CH_2CH_2COOC(CH_3)_3$, $R_3$ is chloro, bromo, hydroxy, cyano, t-butoxy, $CH_2NH_2$, $CONH_2$, $CH=NH$, $CH(OH)NH_2$ or $C(OH)=NH$, $x+y+z=1$, x is 0.1–0.9, y is 0.01–0.89, z is 0.01–0.89, and n is 1 or 2, and when n is 2, both $R_2$ are the same.

In addition, the present invention provides a resist composition comprising (a) a polymer represented by the formula 1, (b) an acid producing agent and (c) an organic solvent.

DETAILED DESCRIPTION AND THE PREFERRED EMBODIMENTS

The present invention will now be explained in more detail.

In order to synthesize a polymer capable of being alkali developed represented by the formula 1, three monomers constituting a polymer are prepared and they are introduced in a reactor equipped with a reflux cooler under a nitrogen environment and are reacted. Tetrahydrofuran (THF), toluene, benzene, chloroform, carbon tetrachloride, etc. can be used as a polymerization solvent. Azobisisobutyronitrile (AIBN) or benzoperoxide (BPO) can be used as a polymerization initiator. Said polymerization solvent and initiator are added to the reactor and reacted while being stirred. After the reaction completes, the synthesized polymer is precipitated in hexane to obtain precipitates, and then the precipitates rinsed several times and vacuum dried to obtain the polymer.

For synthesizing the monomer having a Z repeat unit of the compound of Formula 1, the synthesis of cyanoalkylstyrene by way of Equation 1 should be preceded. To the synthesized 4-cyanoalkylstyrene, t-butyl acrylate and t-butyl methacrylate groups are added, and the prepared monomers are stirred with other monomers such as acetoxystyrene, t-butylacrylate and t-butyl methacrylate to prepare the polymer.

The process for synthesizing the monomer having a Z repeat unit comprises two steps. First, group I cyanide comprising sodium cyanide and potassium cyanide is mixed with alkyl alcohol comprising water and ethanol, as shown in Equation 1. To said solution, alkyl styrene comprising 4-chloroalkylstyrene and halogen atoms is slowly introduced and is reacted to synthesize cyanoalkylstyrene. Then, the monomer obtained in Equation 1 is stirred with t-butylacrylate to synthesize 4-(3-cyano-di-1,5-t-butoxycarbonyl-pentyl)styrene (CBCPS) as shown in Equation 2. Wherein, cyanoalkylstyrene and triton non-solution or tetraalkylaminehydroxide solution are dissolved in dioxane, and then, t-butylacrylate is introduced and stirred After the reaction completes, said mixture is neutralized with an acidic solution and is extracted to synthesize CBCPS.

For the synthesis of the polymer of the present invention, THF, toluene, benzene, chloroform or carbon tetrachloride can be used as polymerization solvent 4-acetoxystyrene or 4-butoxystyrene is added to the prepared CPCBS with 4-butylacrylate or 4-butylmethacrylate, and the polymerization initiator such as AIBN and BPO is added and the mixture is stirred to prepare a polymer Said polymer has a weight average molecular weight (Mw) of 3,000–30,000, and the degree of dispersion can be controlled from 101 to 300 depending on the synthetic process The substitute monomer used in the present invention exhibits sufficient development inhibiting capacity at the non-light-exposed part, and the substitute group is degraded by the action of acid and is dissolved in developing liquid at the light-exposed part.

The resist composition using the polymer of the present invention comprises (a) a polymer represented by the formula 1, (b) an acid producing agent and (c) an organic solvent.

The resist composition using the polymer of the present invention preferably comprises 1–50 wt % of said polymer.

As the acid producing agent, sulfonium salt, an onium salt such as iodonium, N-iminosulfonate, disulfone, bisarylsulfonyidiazomethane and arylcarbonylarylsulfonyldiazomethane can be used. Preferably, the acid producing agent is contained in the resist composition in an amount of 0.1 to 50 wt %.

The examples of sulfonium salt include the following compounds but are not limited to them

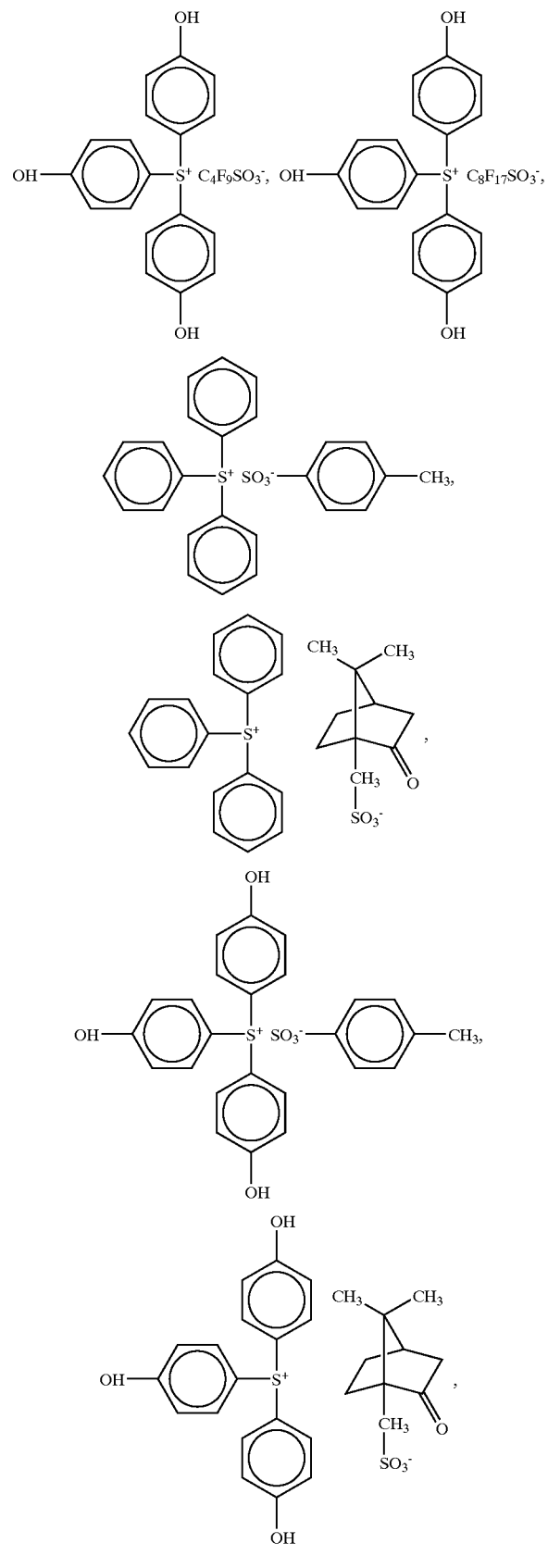

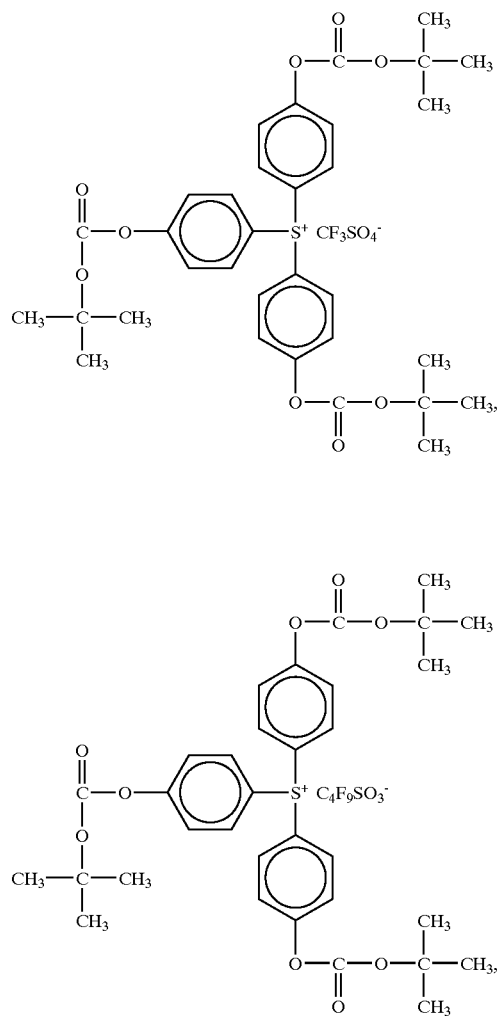
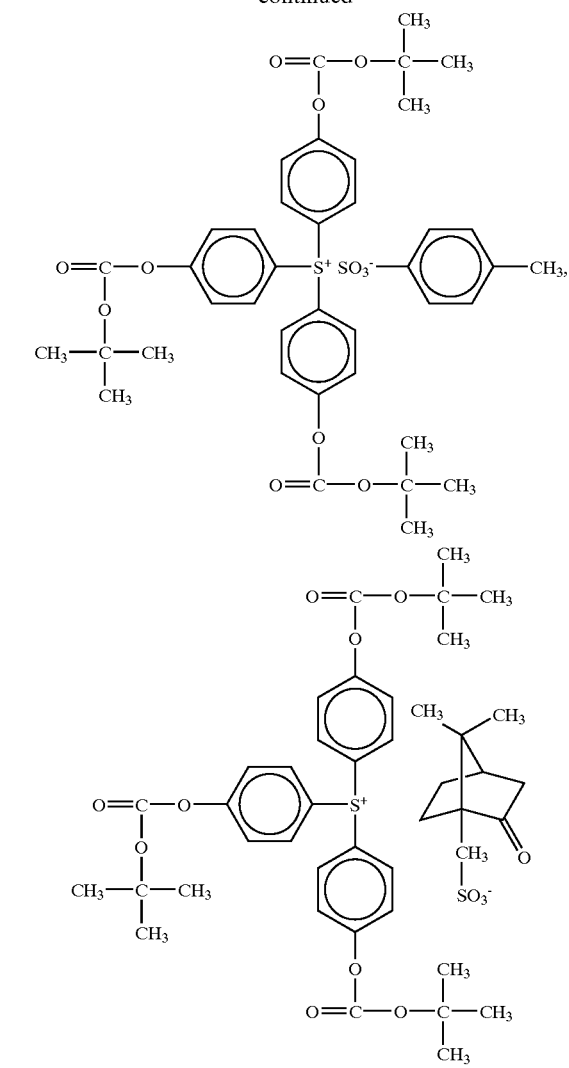
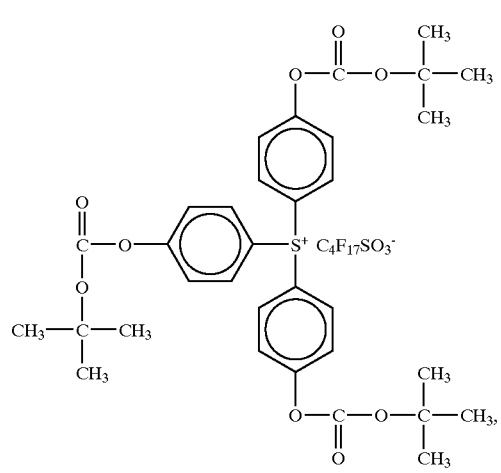
The example of onium salt include the following compounds.
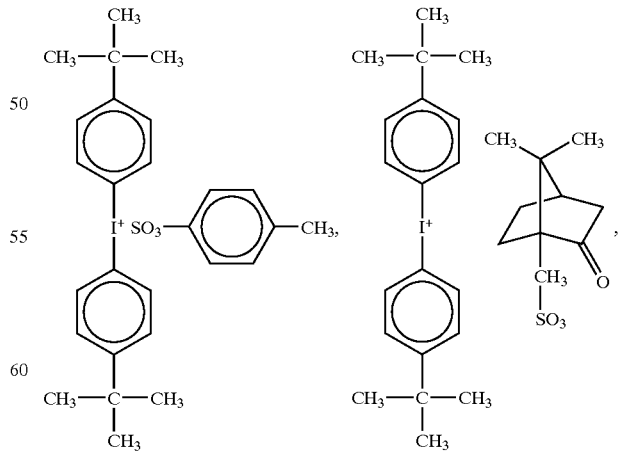

-continued

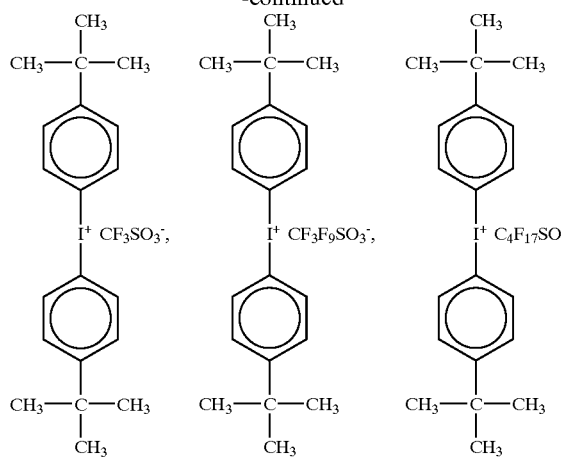

The examples of N-iminosulfonates include the following compounds.

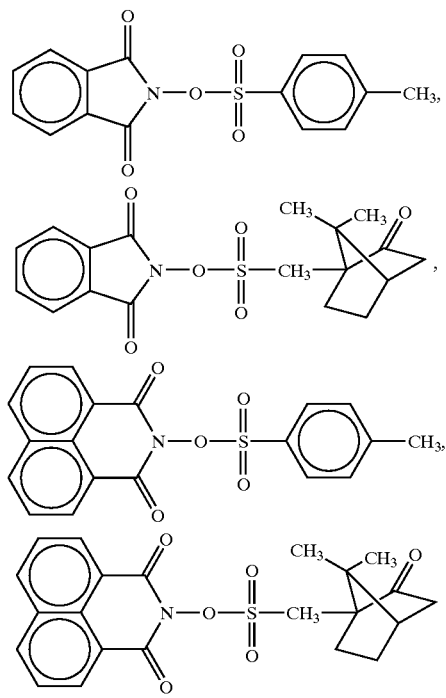

The examples of disulfones include the following compound.

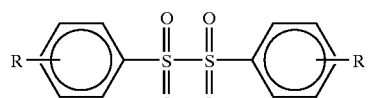

(Wherein R is H, —CH$_3$ or —C(CH$_3$)$_3$.)

The examples of bisarylsulfonyldiazomethanes include the following compound.

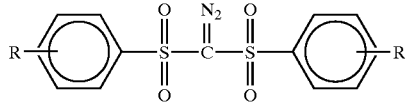

(Wherein R is H, —CH$_3$ or —C(CH$_3$)$_3$.)

The examples of arylcarbonylarylsuffonyldiazomethanes include the following compound.

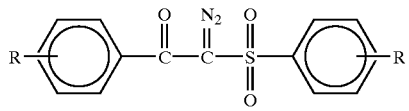

(Wherein R is H, —CH$_3$ or —C(CH$_3$)$_3$)

The organic solvent is preferably selected from the group consisting of ethyleneglycol monoethylether acetate, propyleneglycol monomethylether acetate, ethylether acetate n-butyl acetate, methyl isobutyl ketone ethyl lactate, 3-ethoxy-ethylpropionate, 3-methoxy-methylpropionate, diglycol monoethylether, 2-heptanone, diacetone alcohol, β-methoxyisobutyric acid methylester, propyleneglycol monoethylether, propyleneglycol monomethylpropionate, methyl lactate, butyl lactate, ethyl pyruvate, γ-butyrol lactone, and a mixture thereof Preferably, the organic solvent is contained in the resist composition in an amount of 01 to 99 wt %.

The resist composition using the polymer of the present invention may comprise a dissolution inhibitor in order to improve the dissolution inhibition of the non-light-exposed part The use of the dissolution inhibitor makes the difference of solubility of the light-exposed part and non-light-exposed part larger and contributes to the improvement of contrast. Such dissolution inhibiting additives can be added in the resist composition in an amount of 0.1 to 50 wt % based on the weight of the polymer of the present invention.

The examples of the dissolution inhibitor include the following compounds but are not limited to them.

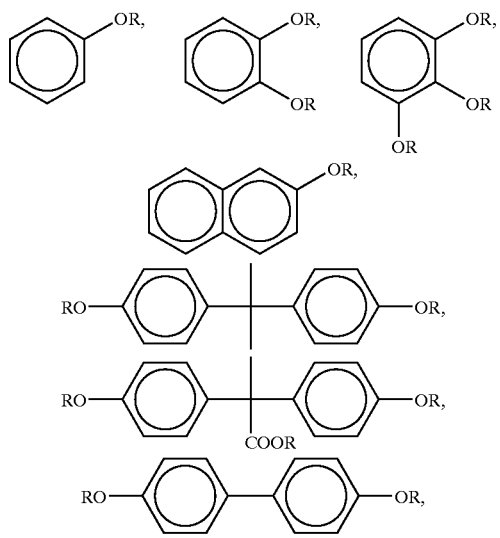

-continued

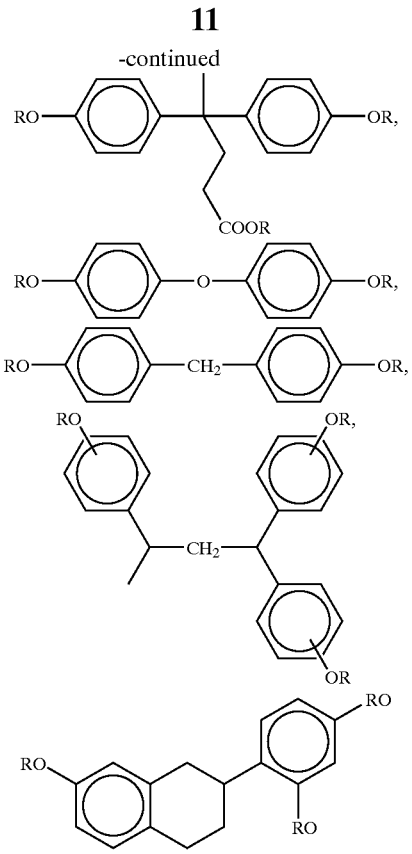

(Wherein R is a molecule comprising $C_1$–$C_{10}$ and H and O)

The resist composition using the polymer of the present invention can be applied as follows to obtain a micro-pattern When the resist composition using the polymer of the present invention is formed as a thin layer on a substrate such as a silicone wafer and is treated with a base aqueous solution, the dissolution does not occur because the solubility of the copolymer is low. However, when extreme ultraviolet light is radiated, the resist responds and the acid producing agent in the resist produces acid, and the development inhibiting substituent causes the degradation of the polymer structure by the action of heat addition in the light-exposed part and the acid is produced again. Consequently, one acid that was produced causes chemical amplification which causes a plurality of acid active degradation. As a result, the solubility of the polymer largely increases in the light-exposed part, and, when developing with the base aqueous solution, the difference in the solubilities of the light exposed part and non-exposed part appears Thus, a resist composition having excellent resolution compared to the resist composition using G-rays and I-rays of the prior art can be obtained The present invention will be explained in more detail with reference to the following Examples and Comparative Examples However these are to illustrate the present invention, and the present invention is not limited to them.

The Synthesis of Polymer

The synthesis of 4-cyanomethylstyrene(CyMS)

In a 500 µl 4-opening flask equipped with a stirring bar, 49.01 g of sodium cyanide was mixed with 70.07 g of water and 50.96 g of ethanol. Then, the temperature of the flask was elevated to 60° C. and the sodium cyanide was completely dissolved. To said solution, 87.50 g of 4-chloromethylstyrene was slowly added and it was reacted for 3 hours while stirring and maintaining the reaction temperature within 60–70° C. When the reaction terminated, said solution was cooled to 40° C., and 100 g of diethylether was added and the diethylether layer was separated. The separated organic layer was extracted with 300 g of water three times, and the water layer was extracted with 50 g of diethylether and was combined with said organic layer. The separated obtained organic layer was dried with magnesium sulfate for one day, and then the organic solvent was removed using an evaporator to obtain the product 4-cyanomethylstyrene. The yield of the product was 80%, and the product was a deep purple color.

Said synthesis was according to the Equation 1.

[Equation 1]

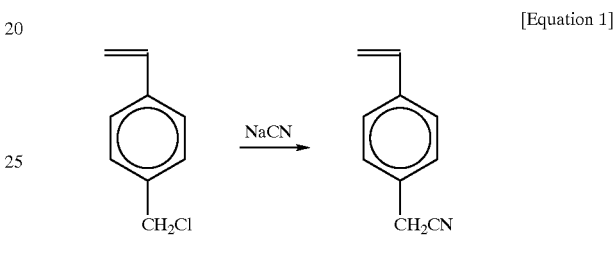

The Synthesis of 4-(3-cyano-di-1,5-t-butoxycarbonyl-pentyl)styrene (CBCPS)

In a 500 ml 4-opening flask equipped with a stirring bar, 57.28 g of 4-cyanomethylstyrene prepared in the above process and 14 g of triton non solution were dissolved in 40 g of dioxane. 102.54 g of t-butylacrylate were slowly added to said solution for 30 minutes while maintaining the temperature of the reactor at 60° C., and it was reacted for 24 hours while stirring. After the reaction, the reactant was neutralized with a chloride solution, and the neutralized reactant was extracted with 100 g of diethylether and 300 g of water three times, the water layer was extracted with 50 g of diethylether and combined with the organic layer. The separated obtained organic layer was dried with magnesium sulfate for one day, and then the organic solvent was removed using an evaporator. The obtained product was distillated under reduced pressure to remove unreacted material, and it was recrystallized with methanol to obtain light yellow CBCPS in a 60% yield.

Said synthesis was according to the Equation 2.

[Equation 2]

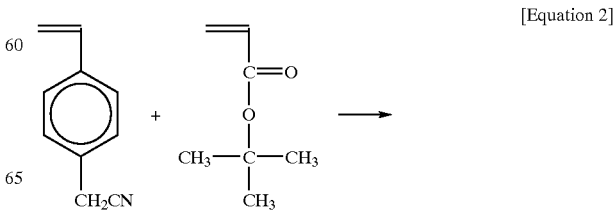

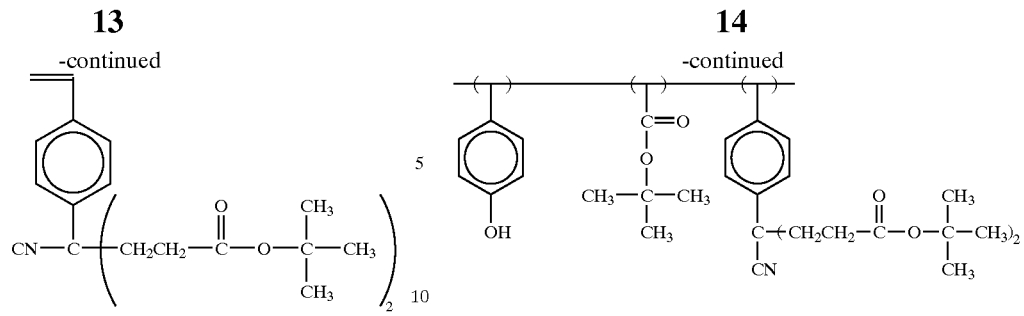

The Synthesis of the Polymer of Formula 1

In a 500 ml 4-opening flask equipped with a temperature controlling apparatus and a nitrogen introducing apparatus, 300 ml of THF were introduced and nitrogen was added and it was stirred for 30 minutes. To said reactor, 56.62 g of 4-acetoxystyrene, 9.16 g of t-butylacrylate and 24.14 g of CBCPS prepared in the above process were introduced, 1.21 g of AIBN were added and stirred for 30 minutes under a nitrogen atmosphere while maintaining the temperature at 40° C., and the temperature of the reactor was then elevated and the reactant was stirred for 24 hours while refluxing. After the completion of the reaction, the temperature was lowered to room temperature and the reactant was deposited in 3 liters of hexane to obtain the precipitates. The obtained precipitates were filtered and rinsed with 2 liters of hexane several times and were vacuum dried. The dried macromolecule was dissolved in 300 ml of methanol in a flask, and 50 ml of 30% NH$_4$OH aqueous solution were added and the mixture was slowly stirred, and, after the polymer was completely dissolved, the mixture was additionally stirred for 30 minutes. The solution was deposited in 1.5 liters of water to obtain the precipitates, and the precipitate were filtered and rinsed with 2 liters of pure water and vacuum dried to obtain 58.23 g of polymer of Formula 1.

The above synthesis was according to Equation 3.

[Equation 3]

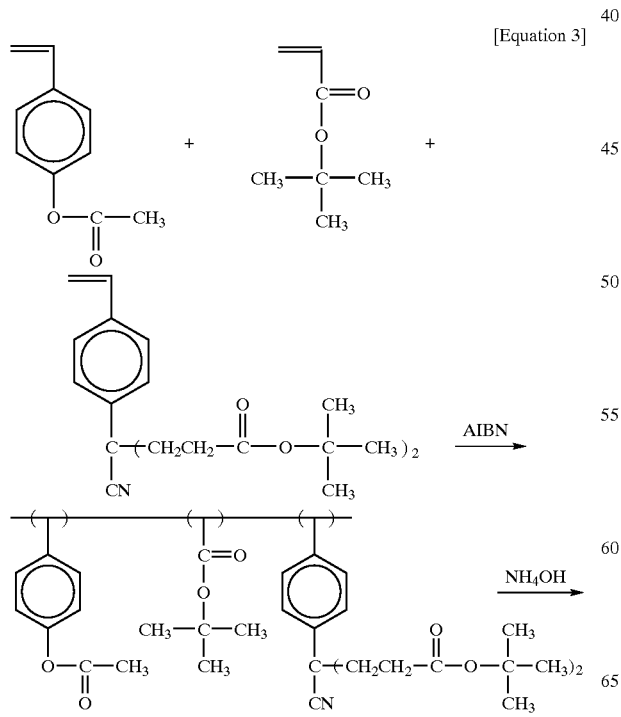

EXAMPLES 1–7

A Chemically Amplified Resist Composition

A chemically amplified resist composition was obtained by using the polymer prepared in the above process represented by Formula 1, the compounds represented by Formulae 2 to 6 as acid producing agents, and propyleneglycolmonomethyletheracetate (PGMEA) and ethyl lactate (EL) as solvents in the ratios of Table 1.

[Formula 2]

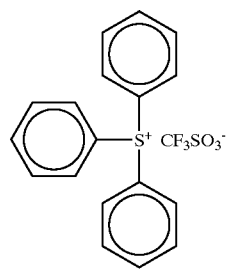

[Formula 3]

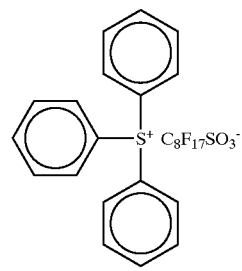

[Formula 4]

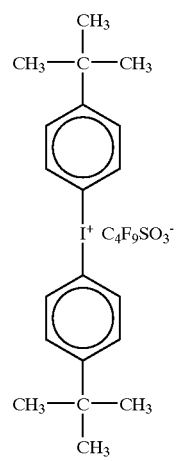

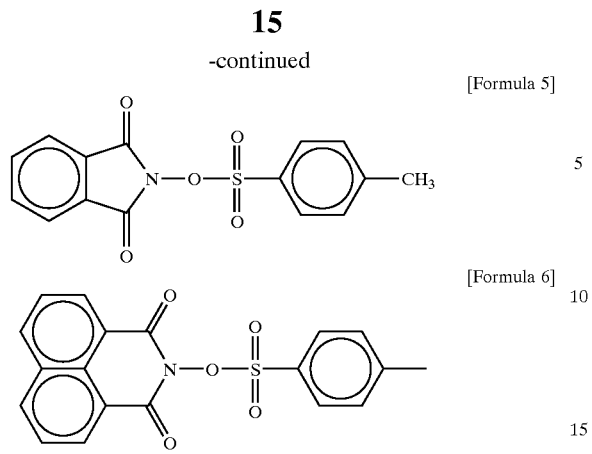

[Formula 5]

[Formula 6]

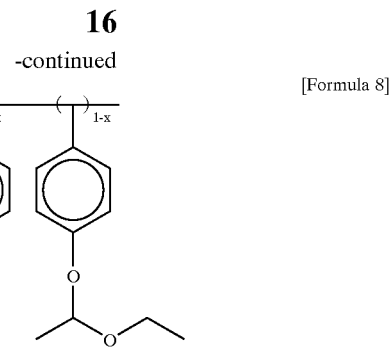

[Formula 8]

Said chemically amplified resist composition was spin coated on silicone wafers at 2000 rpm and was heated to 100° C. for 90 seconds to form thin layers with thicknesses' as described in Table 1. Micro-pattern masks were mounted on said thin layers, mono wavelengths of 248 nm were radiated, and said layers were heated to 110° C. for 90 seconds to cause the chemical amplification. Then, said layers were developed with a tetramethylammoniumhydroxide aqueous solution for 60 seconds, and then were rinsed with pure water and dried to embody micro-patterns on wafers.

The relative sensitivities and resolutions of micro-patterns are described in Table 1.

COMPARATIVE EXAMPLES 1–4

Chemically amplified resist compositions were prepared by using polyhydroxystyrene blocked with t-BOC(tertiary-butoxy carbonyl) group represented by the formula 7 and EVE (ethyl vinyl ether) represented by the formula 8 as polymers, the compounds represented by the formulae 2–6 as acid producing agents, and propyleneglycolmonomethyletheracetate(PGMEA) and ethyllactate(EL) as solvents, in the ratios of Table 1. Said compositions were spin coated on silicone wafers and were heated to form thin layers, and were chemically amplified to embody micro-patterns, in the same manner as described in the Examples 1 to 7

The relative sensitivities and resolutions of the micro-patterns are described in Table 1

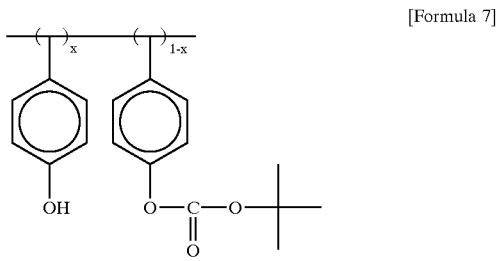

[Formula 7]

TABLE 1

| | The composition of the resists | | | The physical property of pattern | | |
|---|---|---|---|---|---|---|
| | Polymer (weight part) | Acid producing agent (weight part) | Solvent (weight part) | Thickness of thin layer ($\mu$m) | Relative sensitivity (mj/cm$^2$) | Resolution ($\mu$m) |
| Example 1 | Formula 1 (100) | Formula 2 (5) | PGMEA (550) | 0.72 | 31 | 0.18 |
| Example 2 | Formula 1 (100) | Formula 3 (5) | PGMEA (550) | 0.72 | 30 | 0.18 |
| Example 3 | Formula 1 (100) | Formula 4 (2) Formula 5 (2) | PGMEA (550) | 0.74 | 32 | 0.16 |
| Example 4 | Formula 1 (100) | Formula 2 (3) Formula 5 (2) | PGMEA (250) EL (300) | 0.73 | 31 | 0.16 |
| Example 5 | Formula 1 (100) | Formula 4 (3) Formula 6 (2) | PGMEA (550) | 0.72 | 27 | 0.18 |
| Example 6 | Formula 1 (100) | Formula 2(3) Formula 6 (2) | PGMEA (550) | 0.71 | 28 | 0.20 |
| Example 7 | Formula 1 (100) | Formula 3 (3) Formula 6 (2) | PGMEA (550) | 0.71 | 33 | 0.18 |
| Comparative Example 1 | Formula 7 (30) | Formula 2 (5) | PGMEA (550) | 0.73 | 35 | 0.24 |
| Comparative Example 2 | Formula 7 (40) Formula 8 (60) | Formula 3 (5) | PGMEA (250) EL (300) | 0.73 | 38 | 0.24 |
| Comparative Example 3 | Formula 7 (100) | Formula 2 (3) Formula 6 (2) | PGMEA (550) | 0.74 | 39 | 0.30 |
| Comparative Example 4 | Formula 7 (100) | Formula 3 (3) Formula 5 (2) | PGMEA (550) | 0.72 | 42 | 0.28 |

*The relative sensitivity in Table 1 means optimum energy (Eop).

As shown in Table 1, the resist compositions prepared in Examples 1 to 7 of the present invention have resolutions of 0.16 to 0.20 $\mu$m which is much excellent compared to the resolutions of 0.24 to 0.30 $\mu$m of the compositions prepared in Comparative Examples 1 to 4. In addition, the relative sensitivities of the compositions of Examples are 28 to 30 mj/cm$^2$, which are excellent compared to the relative sensitivities of 35 to 45 mj/cm$^2$ of the compositions of Comparative Examples.

The chemically amplified resist composition comprising the polymer represented by the Formula 1 can rapidly respond to mono wavelength in a micro-lithography process using extreme ultraviolet light and form micro-patterns of high-resolution on wafers. In addition, it prevents the modification between a resist latent image that occurs by a time delay between light-exposure and post exposure bake resulting from the environmental effect and a real resist microcircuit pattern after development, as well as the modification of the surface layer of the resist resulting from the reaction of a mineral acid producing agent and the acid produced by base amine, namely, the formation of T-top type pattern. The resist composition of the present invention is suitable for the preparations of 256 mega and giga bit DRAM, because it has high resistance against the heat produced by dry etching.

What is claimed is:

1. A polymer for a chemically amplified resist represented by the following Formula 1:

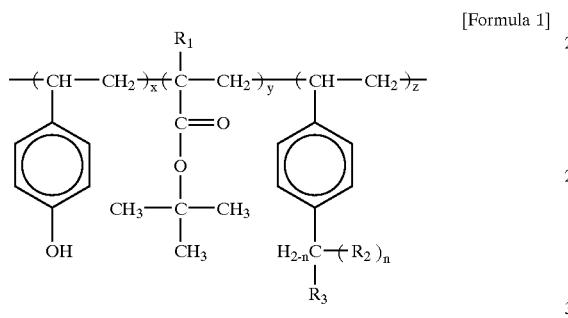

[Formula 1]

wherein $R_1$ is hydrogen or methyl, $R_2$ is hydrogen or $CH_2CH_2COOC(CH_3)_3$, $R_3$ is Cl, Br, hydroxy, cyano, t-butoxy, $CH_2NH$, $CONH_2$, $CH=NH$, $CH(OH)NH_2$ or $C(OH)=NH$, $x+y+z=1$, x is 0.1–0.9, y is 0.01–0.89, z is 0.01–0.89, n is 1 or 2, and when n is 2, both $R_2$ are the same.

2. The polymer for a chemically amplified resist according to claim 1, wherein said polymer has a molecular weight of 3,000 to 30,000 and a degree of dispersion of 1.01 to 3.00.

3. A light sensitive resist composition comprising a) a polymer represented by the following formula 1:

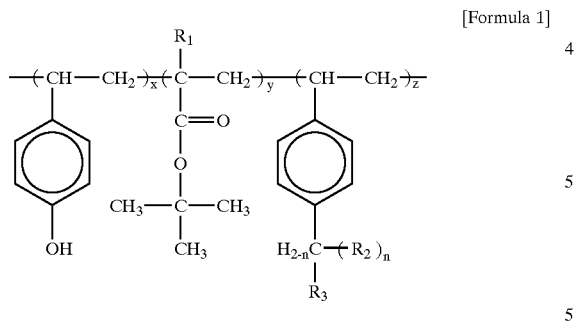

[Formula 1]

wherein $R_1$ is hydrogen or methyl, $R_2$ is hydrogen or $CH_2CH_2COOC(CH_3)_3$, $R_3$ is Cl, Br, hydroxy, cyano, t-butoxy, $CH_2NH$, $CONH_2$, $CH=NH$, $CH(OH)NH_2$ or $C(OH)=NH$, $x+y+z=1$, x is 0.1–0.9, y is 0.01–0.89, z is 0.01–0.89, n is 1 or 2, and when n is 2, both $R_2$ are the same, b) an acid producing agent; and c) a solvent.

4. A light sensitive resist composition according to claim 3, wherein said polymer represented by Formula 1 is contained in the composition in an amount of 0 1 to 50 wt %.

5. A light sensitive resist composition according to claim 3, wherein said b) acid producing agent is selected from the group consisting of:

sulfonium salt selected from:

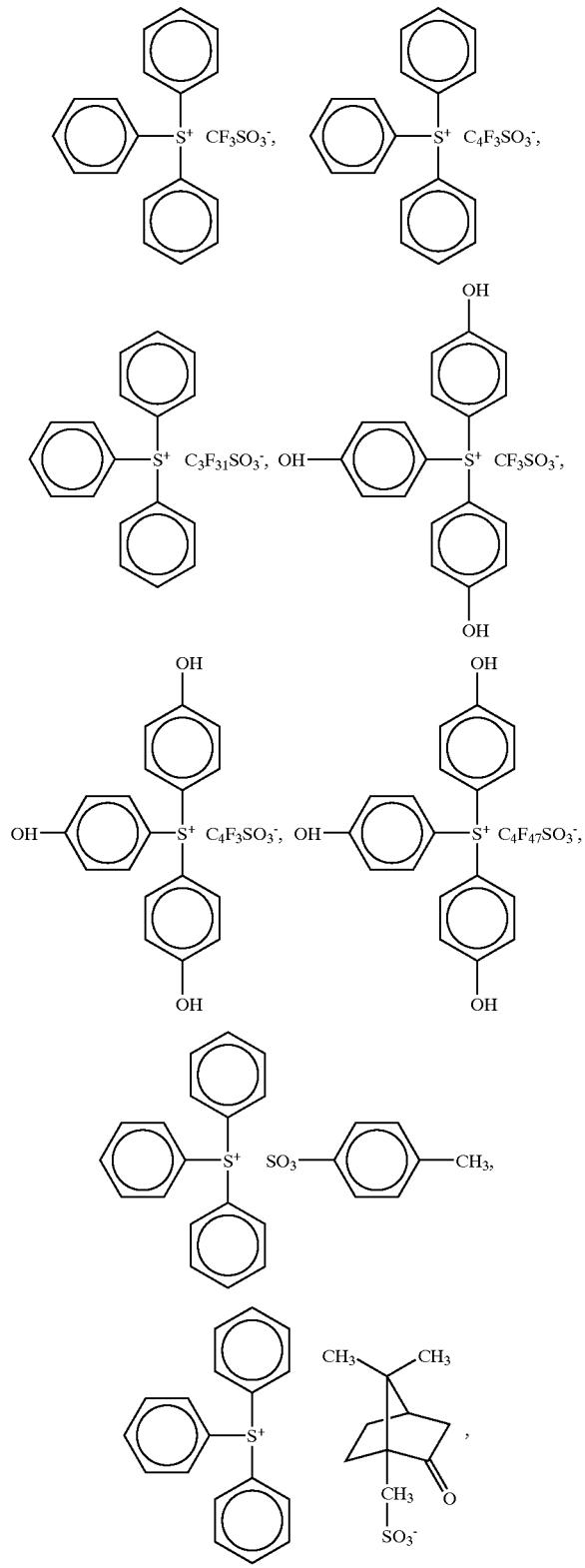

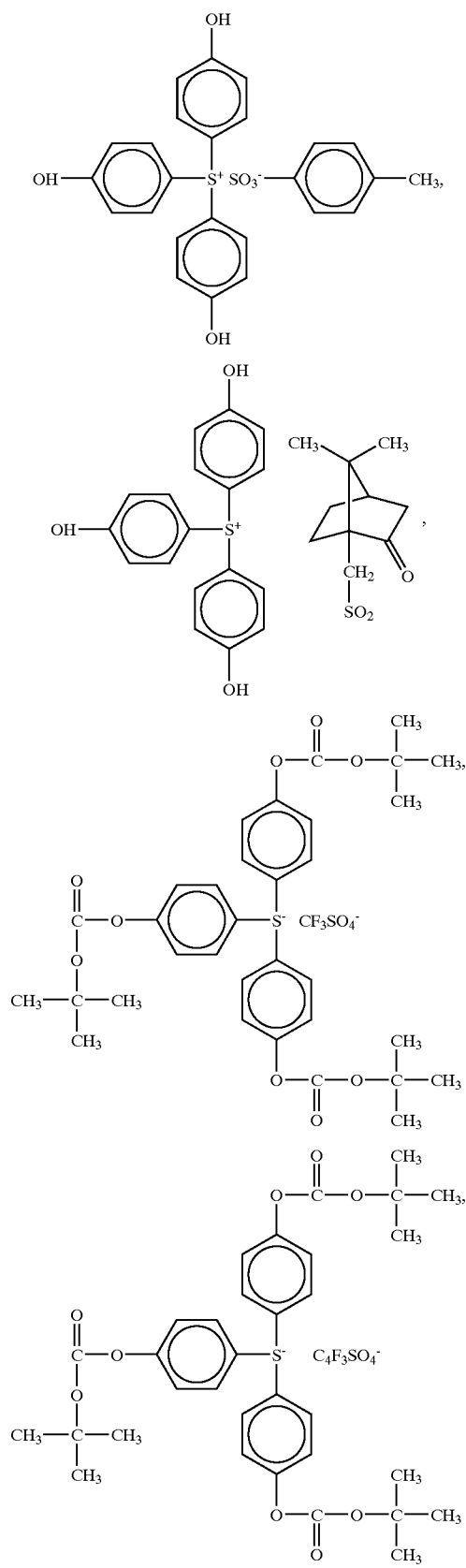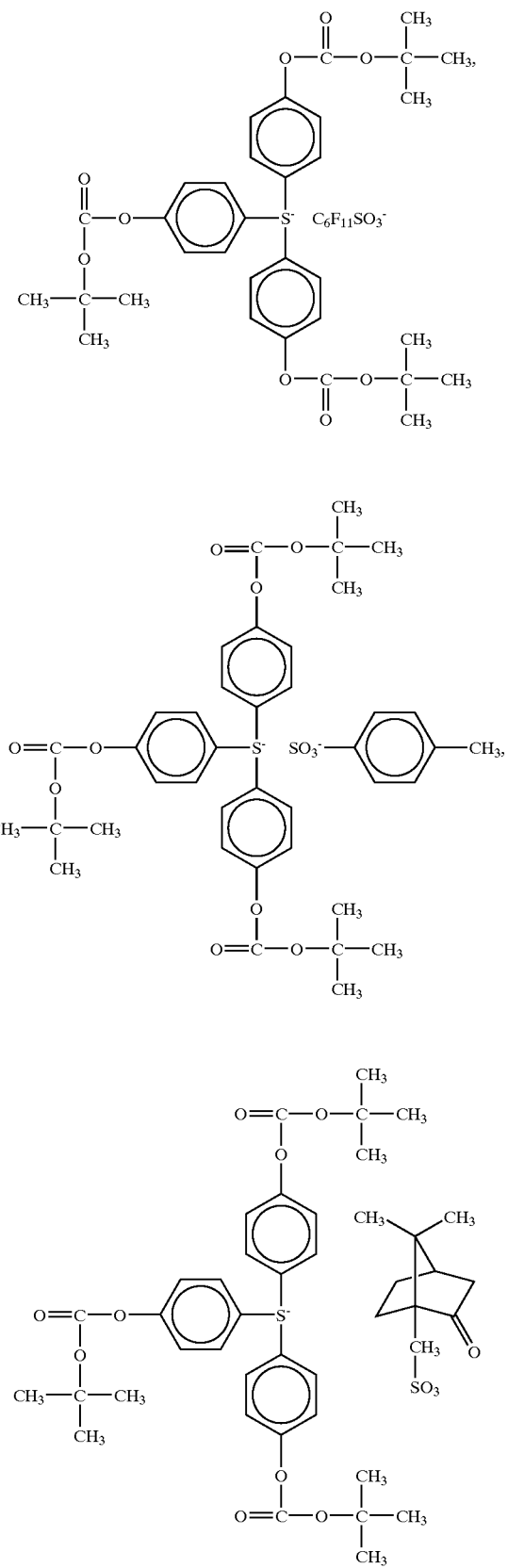

iodonium salt selected from:
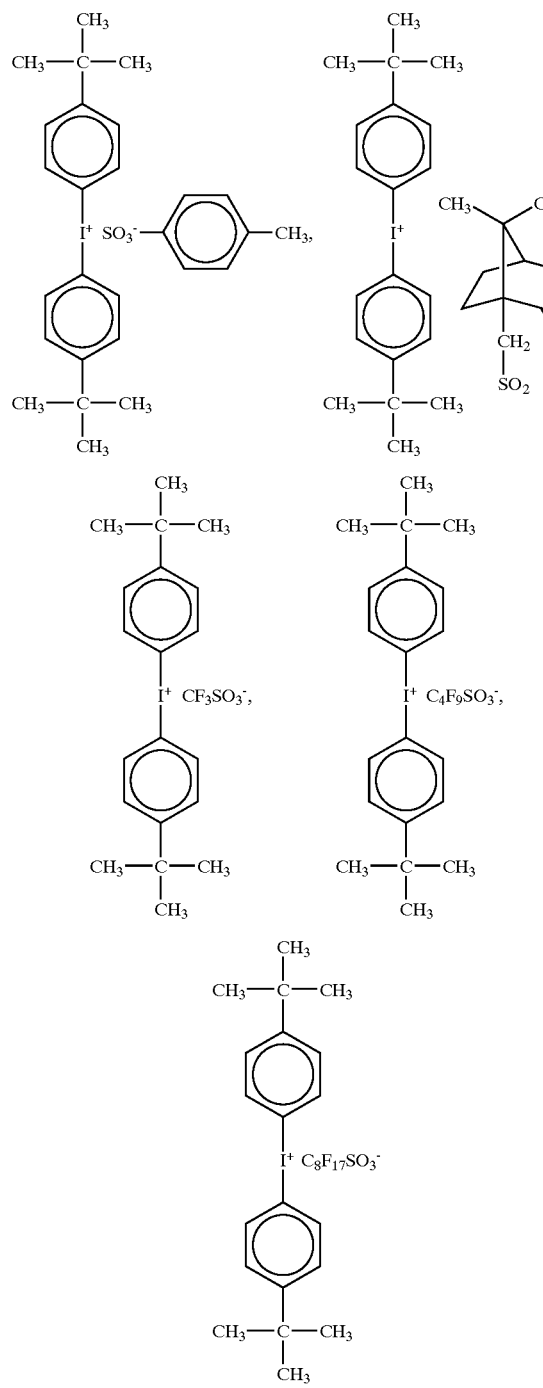
N-iminosulfonates selected from:
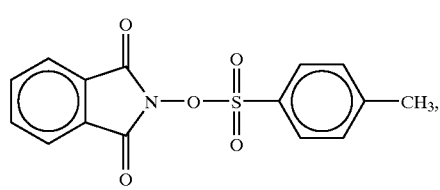
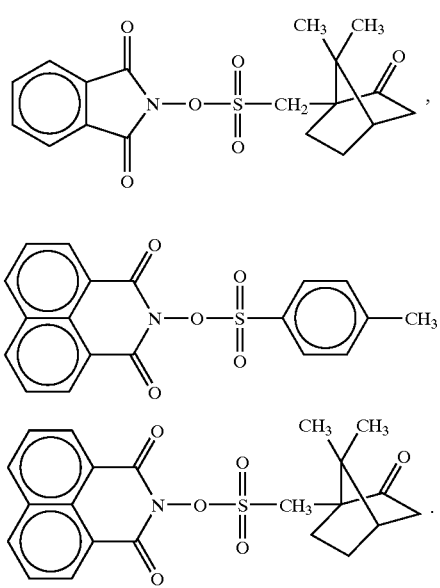
disulfonates which is
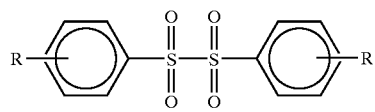
(wherein R is H, —CH₃ or —C(CH₃)₃)
bisarylsulfonyldiazomethane which is
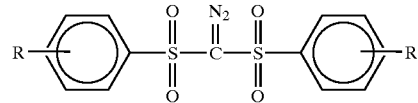
(wherein R is H, —CH₃ or —C(CH₃)₃)
arylcarbonylarylsulfonyldiazomethane which is
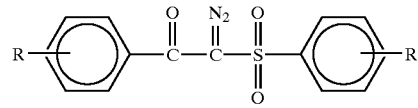
wherein R is H, —CH₃ or —C(CH₃)₃),
and a mixture thereof,
and said acid producing agent is contained in the composition in an amount of 0.1 to 50 wt %.
* * * * *